United States Patent
Liu et al.

(10) Patent No.: US 9,344,270 B2
(45) Date of Patent: May 17, 2016

(54) PHASE DETECTION AND CORRECTION FOR NON-CONTINUOUS LOCAL OSCILLATOR GENERATOR

(71) Applicant: QUALCOMM Incorporated, San Diego, CA (US)

(72) Inventors: Li Liu, San Diego, CA (US); Praveen-Kumar Sampath, San Diego, CA (US); Lai Kan Leung, San Marcos, CA (US); Chiewcharn Narathong, Laguna Nigel, CA (US); Soon-Seng Lau, San Diego, CA (US); Ketan Humnabadkar, San Diego, CA (US); Raghu Narayan Challa, San Diego, CA (US); Devavrata Vasant Godbole, Carlsbad, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 13/829,232

(22) Filed: Mar. 14, 2013

(65) Prior Publication Data

US 2014/0270032 A1    Sep. 18, 2014

(51) Int. Cl.
*H03D 3/24* (2006.01)
*H04L 27/20* (2006.01)
*H04L 7/033* (2006.01)
(Continued)

(52) U.S. Cl.
CPC .............. *H04L 7/0331* (2013.01); *H03B 21/01* (2013.01); *H04W 52/0209* (2013.01); *H04W 52/02* (2013.01)

(58) Field of Classification Search
CPC ........ H04B 1/005; H04B 1/0057; H04B 1/406; H04L 7/033; H04L 7/093; H04L 7/0331
USPC .......................... 375/376, 377, 327, 373, 371
See application file for complete search history.

(56) References Cited

U.S. PATENT DOCUMENTS 5,422,918 A * 6/1995 Vartti et al. .................... 375/371
5,852,728 A * 12/1998 Matsuda et al. ............... 713/501
(Continued)

FOREIGN PATENT DOCUMENTS

| EP | 1282239 A1 | 2/2003 |
| EP | 1968211 A1 | 9/2008 |
| WO | 2012041337 A1 | 4/2012 |

OTHER PUBLICATIONS

International Search Report and Written Opinion—PCT/US2014/021891—ISA/EPO—Jul. 2, 2014.

*Primary Examiner* — Qutbuddin Ghulamali

(57) ABSTRACT

Techniques for detecting and correcting phase discontinuity of a local oscillator (LO) signal are disclosed. In one design, a wireless device includes an LO generator and a phase detector. The LO generator generates an LO signal used for frequency conversion and is periodically powered on and off. The phase detector detects the phase of the LO signal when the LO generator is powered on. The detected phase of the LO signal is used to identify phase discontinuity of the LO signal. The wireless device may further include (i) a single-tone generator that generates a single-tone signal used to detect the phase of the LO signal, (ii) a downconverter that downconverts the single-tone signal with the LO signal and provides a downconverted signal used by the phase detector to detect the phase of LO signal, and (iii) phase corrector that corrects phase discontinuity of the LO signal in the analog domain or digital domain.

34 Claims, 11 Drawing Sheets

(51) Int. Cl.
*H03B 21/01* (2006.01)
*H04W 52/02* (2009.01)

(56) References Cited

U.S. PATENT DOCUMENTS

| | | |
|---|---|---|
| 6,256,511 B1 | 7/2001 | Brown et al. |
| 7,050,775 B2 | 5/2006 | Mayor et al. |
| 7,639,821 B2 | 12/2009 | Zinser |
| 8,576,948 B2 * | 11/2013 | Matsuura et al. ............ 375/302 |
| 8,854,098 B2 * | 10/2014 | Yang et al. .................... 327/233 |
| 2004/0208263 A1 * | 10/2004 | Rives et al. ................... 375/327 |
| 2005/0069056 A1 | 3/2005 | Willingham |
| 2006/0166638 A1 * | 7/2006 | Iwaida .......................... 455/318 |
| 2009/0016252 A1 * | 1/2009 | Ho et al. ....................... 370/311 |
| 2009/0097108 A1 * | 4/2009 | Fox et al. ...................... 359/385 |
| 2010/0073222 A1 * | 3/2010 | Mitomo et al. ............... 342/175 |
| 2010/0122104 A1 * | 5/2010 | DeFazio et al. ............... 713/401 |
| 2012/0122495 A1 | 5/2012 | Weng et al. |
| 2013/0182599 A1 * | 7/2013 | Bachl et al. .................... 370/252 |

\* cited by examiner

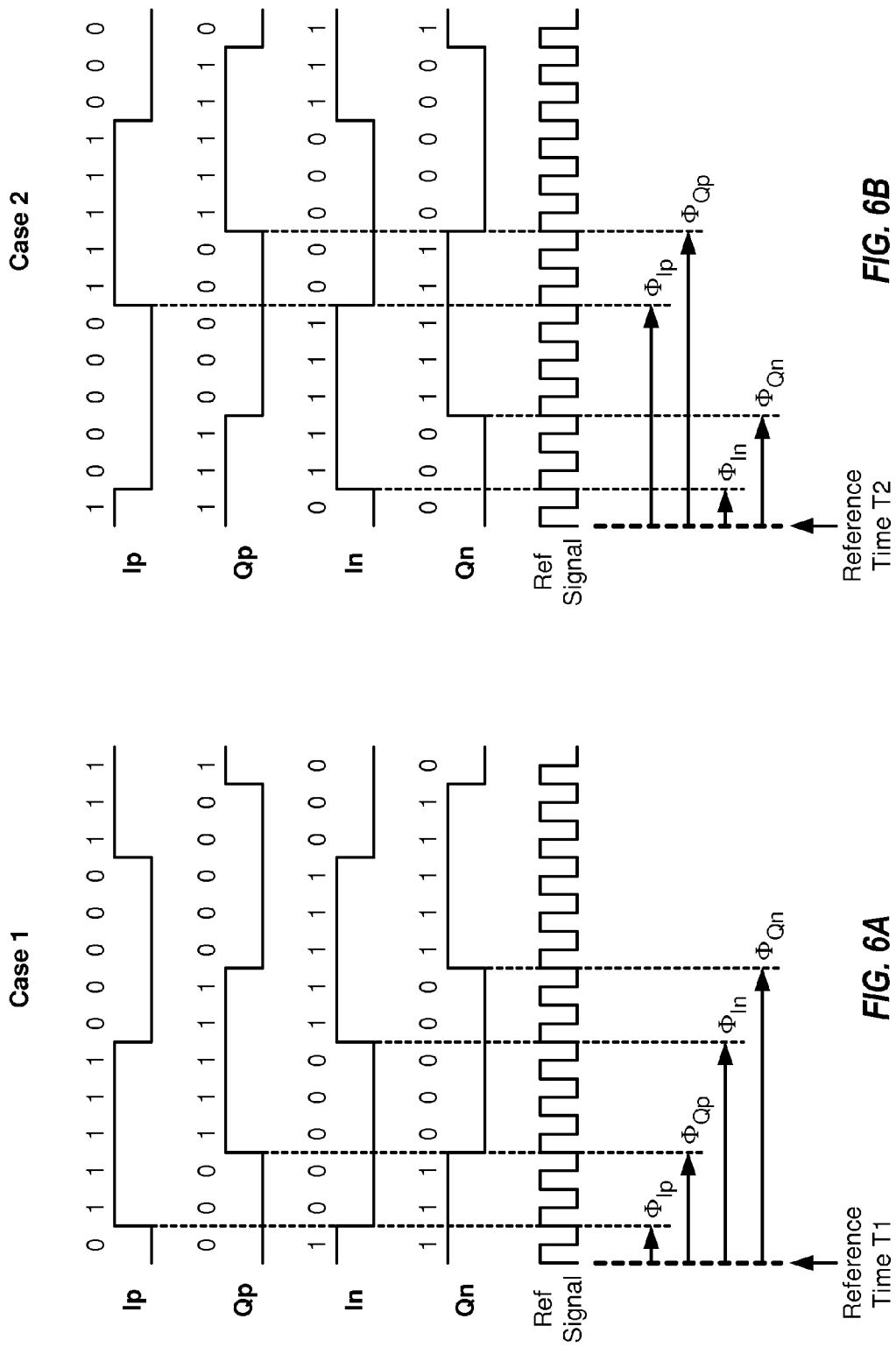

PHASE DETECTION AND CORRECTION FOR NON-CONTINUOUS LOCAL OSCILLATOR GENERATOR

BACKGROUND

I. Field

The present disclosure relates generally to electronics, and more specifically to techniques for generating local oscillator (LO) signals used for frequency conversion.

II. Background

A wireless device (e.g., a cellular phone or a smart phone) may transmit and receive data for two-way communication with a wireless communication system. The wireless device may include a transmitter for data transmission and a receiver for data reception. For data transmission, the transmitter may modulate a transmit LO signal with data to obtain a modulated radio frequency (RF) signal, amplify the modulated RF signal to obtain an output RF signal having the proper transmit power level, and transmit the output RF signal via an antenna to a base station. For data reception, the receiver may obtain a received RF signal via the antenna, amplify and downconvert the received RF signal with a receive LO signal, and process the downconverted signal to recover data sent by the base station. An LO signal is a periodic signal (e.g., a sinusoidal signal or a square-wave signal) at a target frequency and may be used for frequency conversion.

The wireless device may include LO generators to generate the transmit LO signal for the transmitter and the receive LO signal for the receiver. The LO generators may be operated non-continuously and may be powered on generate LO signals only when needed in order to reduce power consumption. It may be desirable to support non-continuous operation of the LO generators.

SUMMARY

Techniques for detecting and correcting phase discontinuity of an LO signal generated by an LO generator that is periodically powered on and off are disclosed herein. The LO generator may be used in a receiver and may be periodically powered on during time intervals for data reception and powered off during the remaining time intervals in order to conserve battery power. Periodically powering on and off the LO generator may result in the LO signal having non-continuous phase.

In an aspect of the present disclosure, the phase of an LO signal from an LO generator may be detected when the LO generator is powered on. Detected phase discontinuity of the LO signal may be corrected in order to achieve continuous phase for the LO signal.

In one design, a wireless device may include an LO generator and a phase detector. The LO generator may generate an LO signal used for frequency conversion and may be periodically powered on and off. The phase detector may detect the phase of the LO signal when the LO generator is powered on. The detected phase of the LO signal may be used to identify phase discontinuity of the LO signal. The wireless device may further include a downconverter, a single-tone generator, and a phase corrector. The single-tone generator may generate a single-tone signal used to detect the phase of the LO signal when the LO generator is powered on. The downconverter may downconvert the single-tone signal with the LO signal and provide a downconverted signal. The phase detector may detect the phase of LO signal based on the downconverted signal.

In one design, the phase detector may include at least one lowpass filter and a phase detection circuit. The lowpass filter(s) may receive the downconverted signal and provide a filtered signal comprising four signals that are 90 degrees out of phase. The phase detection circuit may detect the phases of the four signals and may determine the phase of the LO signal based on the detected phases of the four signals. The phase corrector may correct phase discontinuity of the LO signal (i) in the analog domain by swapping and/or inverting inphase (I) and quadrature (Q) signals of the LO signal or (ii) in the digital domain by rotating I and Q samples obtained from the downconverted signal.

Various aspects and features of the disclosure are described in further detail below.

BRIEF DESCRIPTION OF THE DRAWINGS

FIG. 3 shows an LO signal having a non-continuous phase at power on.

FIGS. 6A and 6B show an example of detecting the phase of an LO signal.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Techniques for detecting and correcting phase discontinuity of an LO signal generated by a non-continuous LO generator are disclosed herein. These techniques may be used for various electronic devices such as wireless communication devices.

Figure 1:
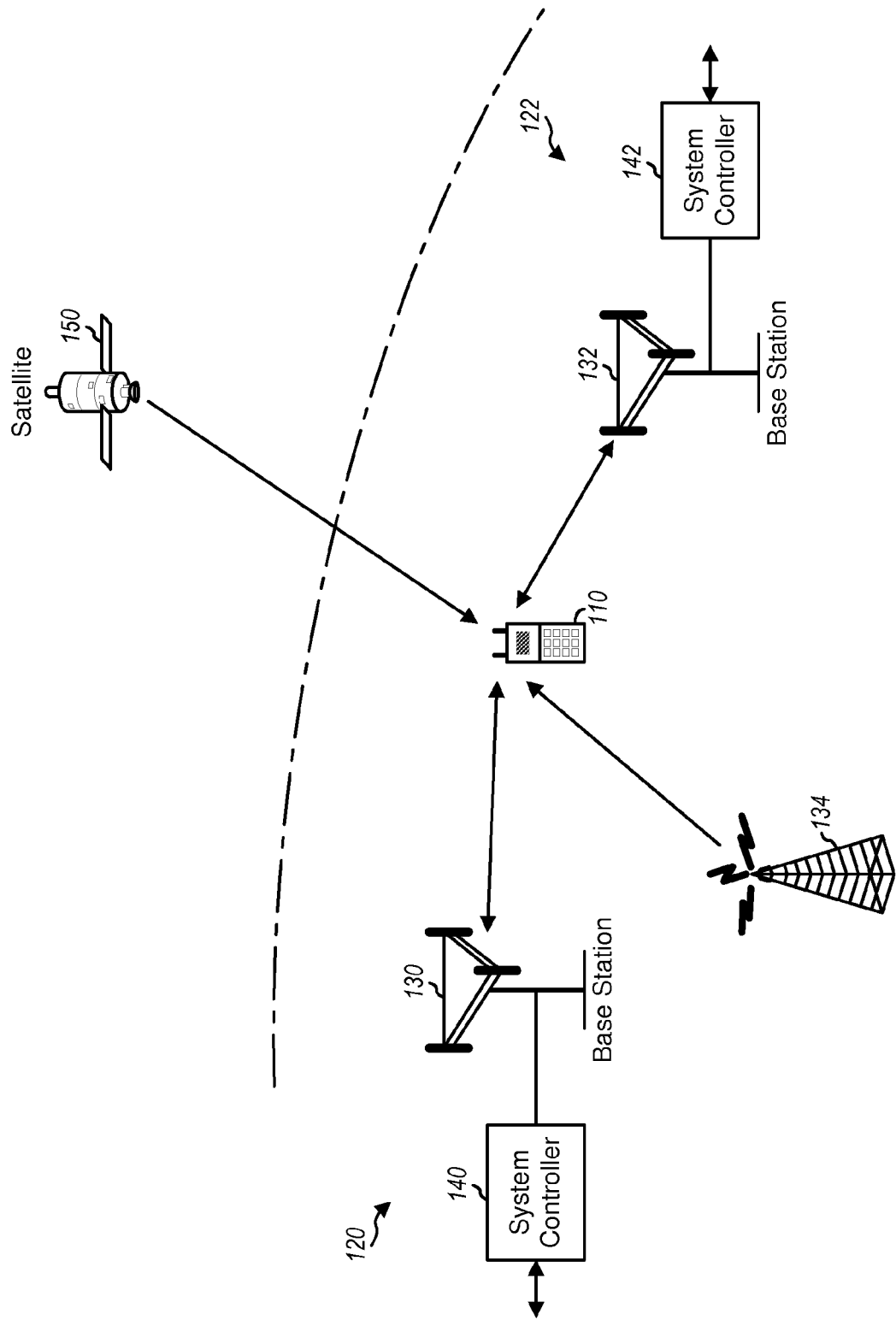
FIG. 1 shows a wireless device communicating with different wireless systems.

FIG. 1 shows a wireless device 110 capable of communicating with different wireless communication systems 120 and 122. Wireless systems 120 and 122 may each be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Time Division Synchronous Code Division Multiple Access (TD-SCDMA), or some other version of CDMA. TD-SCDMA is also referred to as Universal Terrestrial Radio Access (UTRA) Time Division Duplex (TDD) 1.28 Mcps Option or Low Chip Rate (LCR). LTE supports both frequency division duplexing (FDD) and time division duplexing (TDD). For example, wireless system 120 may be an LTE system, and wireless system 122 may be a TD-SCDMA system. For simplicity, FIG. 1 shows wireless system 120 including one base station 130 and one system controller 140, and wireless system 122 including one base station 132 and one system controller 142. In general, each wireless system may include any number of base stations and any set of network entities. Each base station may support communication for wireless devices within its coverage.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, TD-SCDMA, WCDMA, CDMA 1X, GSM, 802.11, etc.

Figure 2:
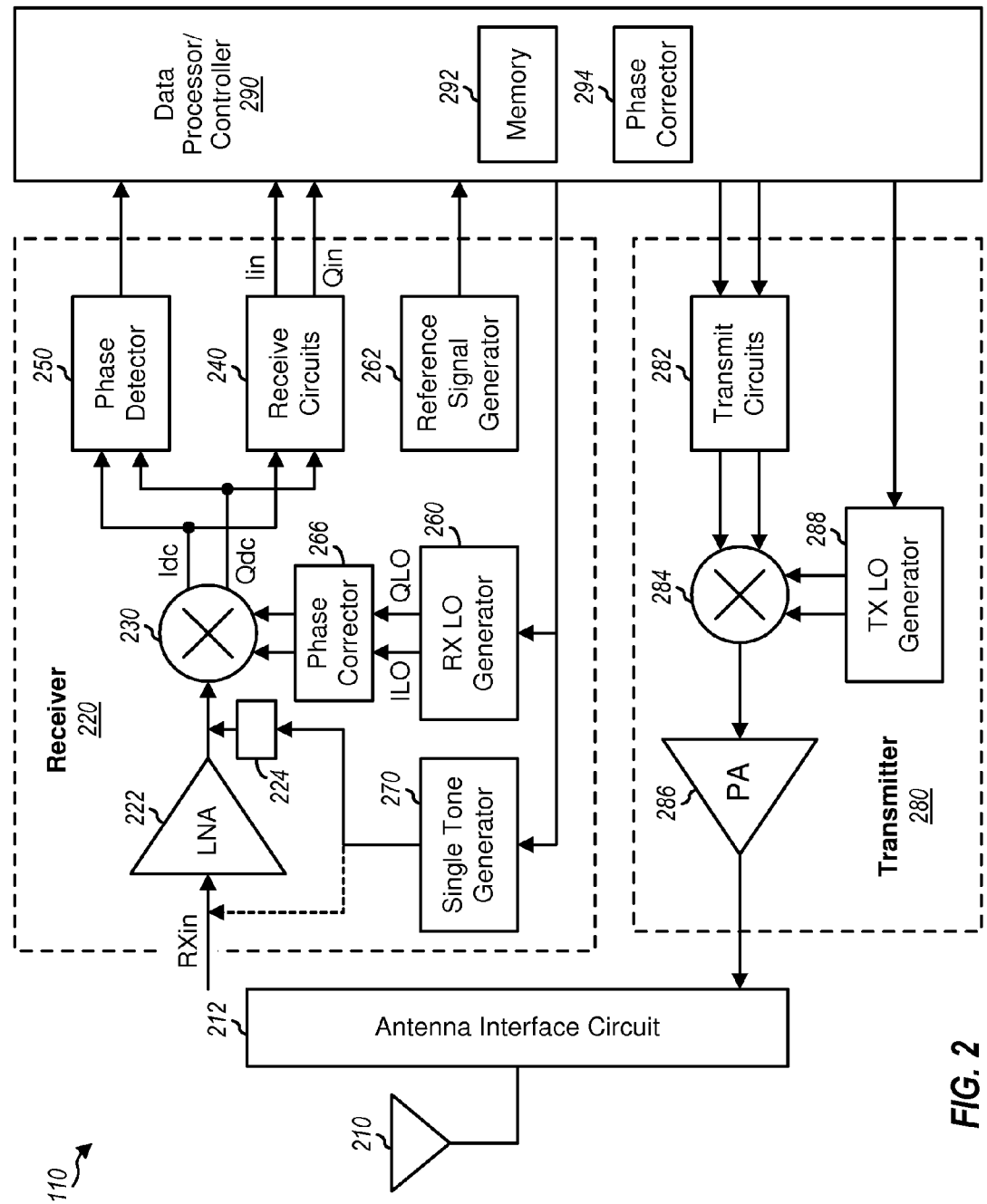
FIG. 2 shows a block diagram of the wireless device in FIG. 1.

FIG. 2 shows a block diagram of an exemplary design of wireless device 110 in FIG. 1. For simplicity, FIG. 2 shows wireless device 110 including one receiver 220 and one transmitter 280 for one antenna 210. In general, wireless device 110 may include any number of transmitters, any number of receivers, and any number of antennas to support communication for any number of radio technologies and any number of frequency bands.

A receiver or a transmitter may be implemented with a super-heterodyne architecture or a direct-conversion architecture. In the super-heterodyne architecture, a signal is frequency converted between RF and baseband in multiple stages, e.g., from RF to an intermediate frequency (IF) in one stage, and then from IF to baseband in another stage for a receiver. In the direct-conversion architecture, which is also referred to as a zero-IF (ZIF) architecture, a signal is frequency converted between RF and baseband in one stage. The super-heterodyne and direct-conversion architectures may use different circuit blocks and/or have different requirements. In the exemplary design shown in FIG. 2, receiver 220 and transmitter 280 are implemented with the direct-conversion architecture. The techniques described herein may be used for both the direct-conversion architecture and the super-heterodyne architecture.

In the receive path, antenna 210 receives downlink signals from base stations and/or other transmitter stations and provides an antenna output signal to an antenna interface circuit 212. Antenna interface circuit 212 routes (and possibly filters) the antenna output signal and provides a received RF signal (RXin) to receiver 220. Antenna interface circuit 212 may include switches, duplexers, diplexer, filters, matching circuits, etc.

Within receiver 220, a low noise amplifier (LNA) 222 amplifies the received RF signal and provides an amplified RF signal via a coupling circuit 224 to a downconverter 230. Downconverter 230 downconverts the amplified RF signal from RF to baseband with an LO signal from an LO generator 260 and provides I and Q downconverted signals (Idc and Qdc). The LO signal comprises an inphase LO signal (ILO) and a quadrature LO signal (QLO), with the QLO signal being 90 degrees out of phase with respect to the ILO signal. Receive circuits 240 amplify and filter the I and Q downconverted signals and provide I and Q input baseband signals (Iin and Qin) to a data processor/controller 290. Receive circuits 240 may include filters, amplifiers, matching circuits, etc. Processor 290 digitizes the I and Q input baseband signals to obtain I and Q samples and further processes the samples to recover data sent to wireless device 110. Some signals within receiver 220 may be differential signals, as described below.

LO generator 260 generates the LO signal for downconverter 230. LO generator 260 may include one or more voltage controlled oscillators (VCOs), phase locked loops (PLLs), reference oscillators, dividers, buffers, etc. A phase corrector 266 may be present and may receive the ILO and QLO signals from LO generator 260 and swaps and/or inverts the signals, if necessary, to obtain phase-corrected ILO and QLO signals having continuous phase. A single-tone generator 270 generates a single-tone signal at a target frequency. A single-tone signal is a periodic signal without any data modulation and includes a fundamental signal component at the target frequency and possibly harmonics at integer multiples of the target frequency. The single-tone signal may be used to detect phase discontinuity of the LO signal, as described below. The single-tone signal may be provided to coupling circuit 224 or to LNA 222. A phase detector 250 receives the I and Q downconverted signals from downconverter 230, detects the phase of the LO signal, and provides the detected phase. A reference signal generator 262 generates a reference signal at a reference frequency and may provide the reference signal to data processor 290, LO generator 260, and/or other circuits.

In the transmit path, data processor 290 processes data to be transmitted and provides I and Q output baseband signals to transmitter 280. Within transmitter 280, transmit circuits 282 amplify and filter the I and Q output baseband signals and provide I and Q conditioned baseband signals. Transmit circuits 282 may include amplifiers, filters, matching circuits, etc. An upconverter 284 upconverts the I and Q conditioned baseband signals from baseband to RF based on a transmit (TX) LO signal from an LO generator 288 and provides a modulated RF signal. A power amplifier (PA) 286 amplifies the modulated RF signal and provides an output RF signal having the proper transmit power level. The output RF signal is routed through antenna interface circuit 212 and transmitted via antenna 210.

FIG. 2 shows an exemplary design of receiver 220 and transmitter 280. A transmitter and a receiver may also include other circuits not shown in FIG. 2, such as filters, matching circuits, etc. FIG. 2 also shows wireless device 110 including one receiver 220 and one transmitter 280. In general, a wireless device may include any number of receivers and any number of transmitters to support any number of frequency bands, any number of antennas, and any number of radio technologies. For example, wireless device 110 may include one or more receivers and one or more transmitters for each of low-band covering frequencies lower than 1000 megahertz (MHz), mid-band covering frequencies from 1000 MHz to 2300 MHz, and/or high-band covering frequencies higher than 2300 MHz. All or a portion of receiver 220 and transmitter 280 may be implemented on one or more RF ICs (RFICs), analog integrated circuits (ICs), mixed-signal ICs, etc. For example, all of the circuits within receiver 220 may be implemented on an RFIC.

Data processor/controller 290 may perform various functions for wireless device 110. For example, data processor 290 may perform processing for data being received via receiver 220 and data being transmitted via transmitter 280. Data processor 290 may include a phase corrector 294 that can process the I and Q samples based on a detected phase of the LO signal to account for phase discontinuity of the LO signal and provide phase-corrected I and Q samples. Controller 290 may control the operation of various circuits in receiver 220 and transmitter 280. A memory 292 may store program codes and data for data processor/controller 290. Data processor/controller 290 may be implemented on one or more application specific integrated circuits (ASICs) and/or other ICs.

Wireless device 110 may communicate with a base station in a wireless system via the downlink and uplink. The downlink (or forward link) refers to the communication link from the base station to the wireless device, and the uplink (or reverse link) refers to the communication link from the wireless device to the base station.

Wireless device 110 may support communication with wireless systems utilizing TDD and/or FDD. For TDD, the downlink and uplink share the same frequency, and downlink transmissions and uplink transmissions may be sent on the same frequency in different time periods. For FDD, the downlink and uplink are allocated separate frequencies. Downlink transmissions may be sent on one frequency, and uplink transmissions may be sent on another frequency. Some exemplary radio technologies utilizing TDD include LTE TDD, TD-SCDMA, and GSM. Some exemplary radio technologies utilizing FDD include LTE FDD, WCDMA, and CDMA 1X.

When communicating with a wireless system utilizing TDD, wireless device 110 may power on the circuitry in receiver 220 only during receive (RX) time and may power off the receiver circuitry during non-RX time in order to conserve battery power. The RX time may cover time periods designated for the downlink (and may cover just time periods that wireless device 110 needs to receive downlink signals). The non-RX time may cover all remaining time periods that are not part of the RX time. For example, wireless device 110 may power on LO generator 260 during RX time and may power off LO generator 260 during non-RX time. LO generator 260 may thus operate in a non-continuous manner.

LO generator 260 may include (i) a frequency synthesizer to generate a VCO signal at a suitable RF frequency and (ii) a frequency divider to divide the VCO signal in frequency and provide an LO signal comprising an ILO signal and a QLO signal. The frequency synthesizer may be locked to a reference signal having a continuous phase at a reference frequency. The frequency synthesizer may thus generate the VCO signal having a continuous phase even though the frequency synthesizer may be continually powered on and off. However, the divider may power up in one of a set of possible states. For example, a divide-by-2 divider may wake up in either state '0' or '1' when it is powered on. The divider may generate ILO and QLO signals having a first phase if it wakes up in state '0' and may generate the ILO and QLO signals having a second phase if it wakes up in state '1'. The ILO and QLO signals may then have non-continuous phase, which may be undesirable or unacceptable.

Figure 3:
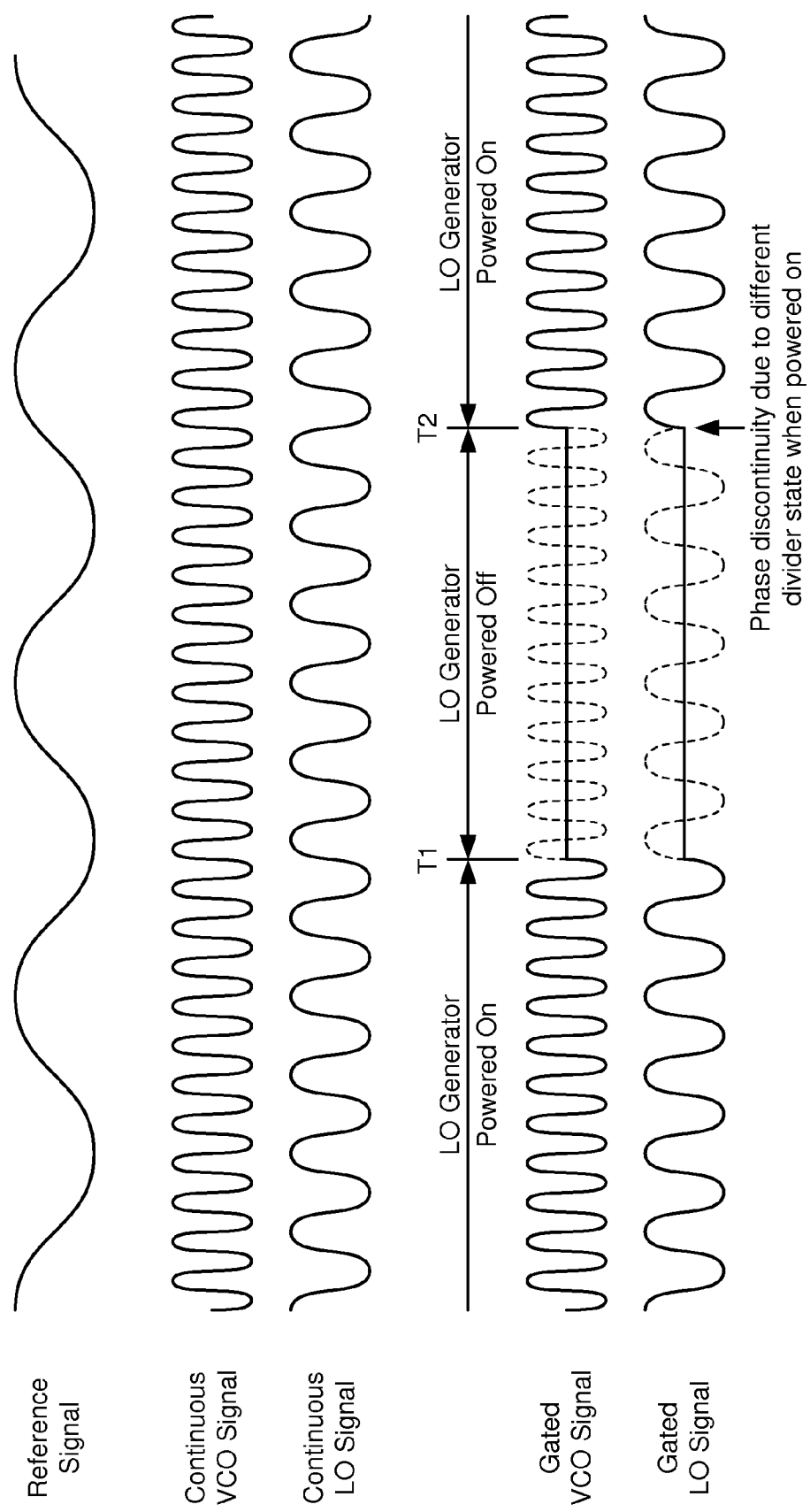

FIG. 3 shows a plurality of signals including an LO signal having a non-continuous phase due to a divider waking up at different states corresponding to different VCO transition edges (e.g., rising and falling edges) when powered up. A reference signal having a continuous phase is shown at the top of FIG. 3 and may be generated by reference signal generator 262 in FIG. 2, which may be powered on all the time. A continuous VCO signal may be generated by a first frequency synthesizer that is powered on all the time. A gated VCO signal may be generated by a second frequency synthesizer that is periodically powered on and off. The gated VCO signal may have continuous phase when the second frequency synthesizer is locked to the reference signal having continuous phase.

A continuous LO signal may be generated by dividing the continuous VCO signal and may have continuous phase. A gated LO signal may be generated by a gated divider that divides the gated VCO signal in frequency. The gated divider may operate in a first state (e.g., state '0') prior to being powered off at time T1 and may operate in a second state (e.g., state '1') after being powered on at time T2. Different states of the gated divider may be associated with different I-Q relationship of the ILO and QLO signals. The gated LO signal may then be non-continuous at time T2 due to the gated divider being at a different state at time T2. In particular, the gated LO signal may have a first phase prior to time T1 and a second phase after time T2, with the second phase being different from the first phase. For a divide-by-2 divider, this phase discontinuity corresponds to 180 degrees of phase rotation of the ILO signal.

An LO signal provided to downconverter 230 should have continuous phase over time (i.e., have no phase discontinuity) in order to properly downconvert an RF signal. Phase continuity may be achieved by powering on a frequency synthesizer and a divider all the time. However, significant battery power may be wasted to power on the frequency synthesizer and the divider, even when they are not needed for data reception during uplink subframes, just to maintain phase continuity of the LO signal.

In an aspect of the present disclosure, the phase of an LO signal may be detected using a single-tone generator, and detected discontinuity in the phase of the LO signal may be corrected. This may enable the LO signal to be generated with a frequency synthesizer and a divider that can be powered on and off in order to conserve battery power. The techniques for detecting and correcting the phase of an LO signal may be used for an LO generator for a receiver as well as an LO generator for a transmitter. For clarity, various details of phase detection and correction are described below for LO generator 260 for receiver 220.

Figure 4:
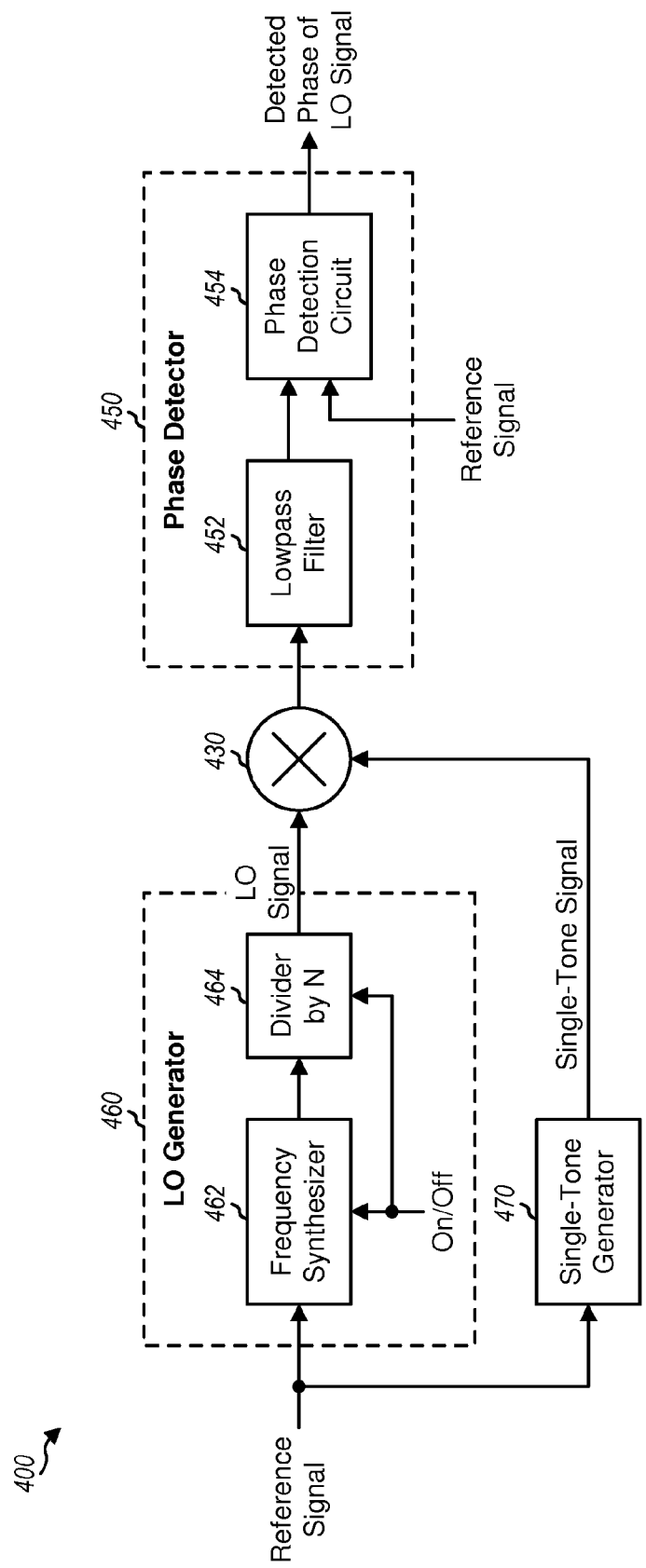
FIG. 4 shows a circuit to detect phase discontinuity of an LO signal.

FIG. 4 shows a design of a circuit 400 that can detect phase discontinuity of an LO signal. An LO generator 460 includes a frequency synthesizer 462 and a divider 464. Frequency synthesizer 462 receives a reference signal at a reference frequency and generates a VCO signal whenever frequency synthesizer 462 is powered on. Divider 464 divides the VCO signal in frequency and provides an LO signal to a downconverter 430. Frequency synthesizer 462 and divider 464 may be powered on or off based on an On/Off control signal.

A single-tone generator 470 receives the reference signal and generates a single-tone signal having continuous phase whenever single-tone generator 470 is powered on. Downconverter 430 downconverts the single-tone signal with the LO signal and provides a downconverted signal. A phase detector 450 detects the phase of the LO signal based on the downconverted signal. Within phase detector 450, a lowpass filter 452 filters the downconverted signal and provides a filtered signal. A phase detection circuit 454 receives the filtered signal and detects the phase of the filtered signal. Since the single-tone signal has continuous phase, the detected phase of the downconverted signal is indicative of the phase of the LO signal from LO generator 460.

Frequency synthesizer 462 generates the VCO signal at a frequency of $N*f_{LO}$, and divider 464 provides the LO signal at a frequency of $f_{LO}$, where $f_{LO}$ may be any suitable frequency and N is a divider ratio of divider 464. Single-tone generator 470 generates the single-tone signal at a frequency of $f_{ST}$, which is different from $f_{LO}$. For example, the VCO signal may be at 2 gigahertz (GHz), the LO signal may be at 1 GHz, and the single-tone signal may be at 999 megahertz (MHz). The downconverted signal includes a first signal component at the difference frequency of to $f_{LO}-f_{ST}$ and a second signal component at the sum frequency of $f_{LO}+f_{ST}$. In the example above, the downconverted signal includes a first signal component at 1 MHz and a second signal component at 1.999 MHz. Lowpass filter 452 filters the downconverted signal to pass the first signal component and attenuate the second signal component. Lowpass filter 452 may also provide gain for the downconverted signal. Phase detection circuit 454 detects the phase of the filtered signal, as described below.

In one design, a single-tone signal may be generated at a fixed frequency to obtain a downconverted signal at a desired baseband frequency. In another design, a single-tone signal may be generated at different frequencies to obtain a downconverted signal at different baseband frequencies. For example, a single-tone signal may be generated such that a downconverted signal ranges between kilohertz (KHz) to MHz (e.g., from 10 KHz to 9.6 MHz).

Figure 5:
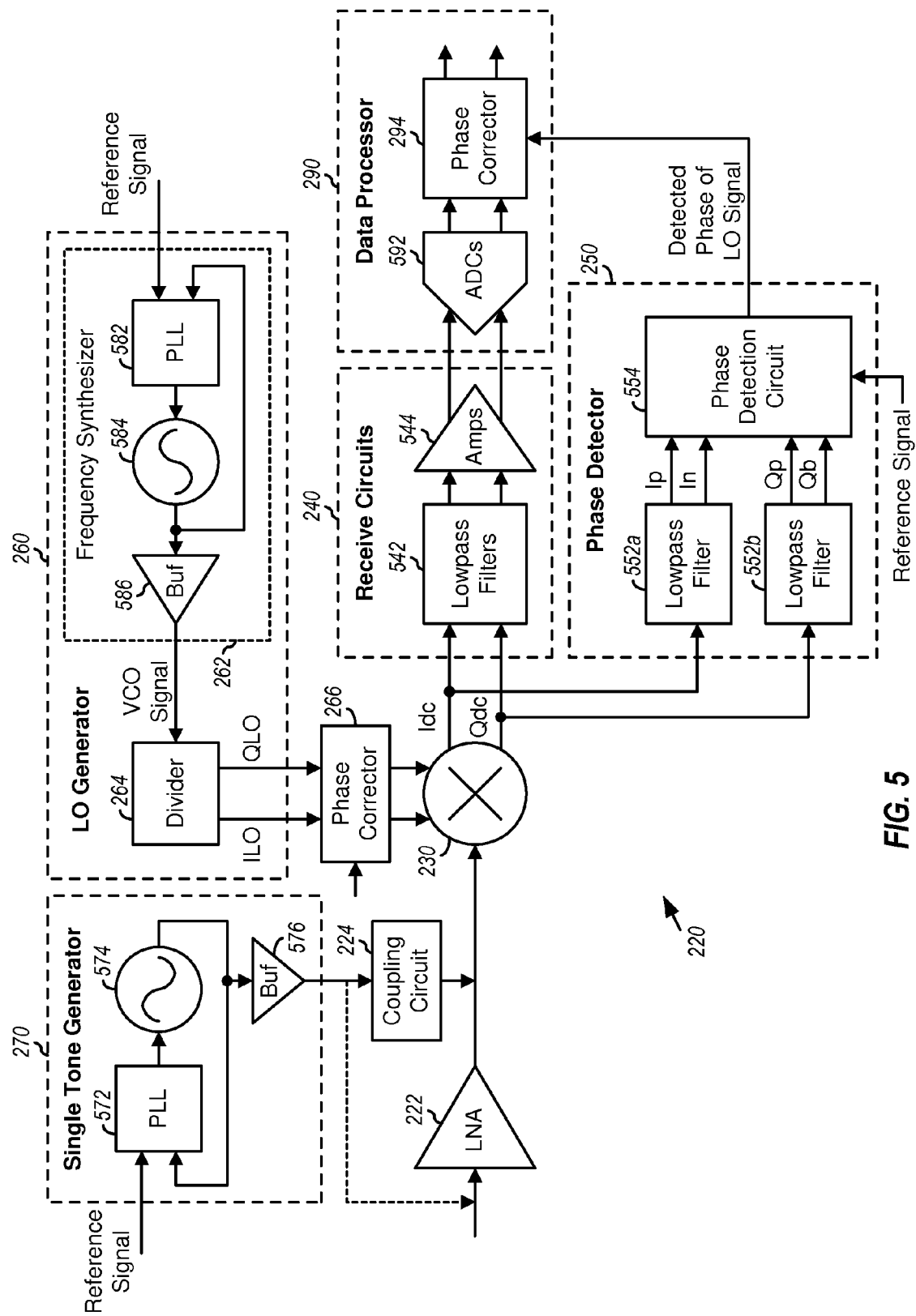
FIG. 5 shows a design of a receiver within the wireless device in FIG. 1.

FIG. 5 shows a block diagram of a design of receiver 220 within wireless device 110 in FIG. 2. LO generator 260 generates an LO signal used by downconverter 230 to downconvert an amplified RF signal from LNA 222. LO generator 260 includes (i) a frequency synthesizer 262 to generate a VCO signal at a desired frequency and (ii) a divider 264 to divide the VCO signal in frequency and provide the LO signal. The LO signal comprises an inphase LO signal (ILO) and a quadrature LO signal (QLO). The ILO and QLO signals may each be a differential signal comprising a non-inverting signal (denoted by a suffix "p") and an inverting signal (denoted by a suffix "n"). For example, the ILO signal may comprise ILOp and ILOn signals that are 180 degrees out of phase. The QLO signal may comprise QLOp and QLOn signals that are 180 degrees out of phase.

In the design shown in FIG. 5, frequency synthesizer 262 includes a PLL 582, a VCO 584, and a buffer (Buf) 586. When frequency synthesizer 262 is powered on, VCO 584 receives a control signal from PLL 582 and generates an oscillator signal at a frequency determined by the control signal. PLL 582 receive the reference signal and the oscillator signal from VCO 584, compares the phase of the oscillator signal against the phase of the reference signal, and generates the control signal for VCO 584 such that the phase of the oscillator signal is locked to the phase of the reference signal. Since the reference signal has continuous phase, the oscillator signal also has continuous phase. Buffer 586 receives the oscillator signal from VCO 584 and provides the VCO signal to divider 264.

Divider 264 divides the VCO signal in frequency by a factor of N, where N may be equal to 2, 3, 4, or some other value. Divider 264 provides ILO and QLO signals. In a first design that is shown in FIG. 5, phase corrector 266 receives the ILO and QLO signals from divider 262 and swaps and/or inverts the signals, if necessary, to obtain phase-corrected ILO and QLO signals having continuous phase. Phase corrector 266 then provides the phase-corrected ILO and QLO signals to downconverter 230. In a second design, divider 264 provides the ILO and QLO signals with non-continuous phase to downconverter 230. In the second design, phase discontinuity of the ILO and QLO signals may be accounted for digitally.

In the design shown in FIG. 5, single-tone generator 270 includes a PLL 572, a VCO 574, and a buffer 576. To avoid phase discontinuity caused by a divider, VCO 574 may directly drive buffer 576, and no divider may be present between VCO 574 and buffer 576. VCO 574 receives a control signal from PLL 572 and generates an oscillator signal at a frequency determined by the control signal. PLL 572 receive the reference signal and the oscillator signal from VCO 574, compares the phase of the oscillator signal against the phase of the reference signal, and generates the control signal for VCO 574 such that the phase of the oscillator signal is locked to the phase of the reference signal. Buffer 576 receives the oscillator signal from VCO 574 and provides a single-tone signal to coupling circuit 224. Buffer 576 may include an attenuator to adjust the amplitude of the single tone signal.

In the design shown in FIG. 5, receive circuits 240 include lowpass filters 542 and amplifiers (Amps) 544. Lowpass filters 542 receive and filter the I and Q downconverted signals and provide I and Q filtered signals. Amplifiers 544 amplify the I and Q filtered signals and provide I and Q baseband signals to data processor 290. Lowpass filters 542 may include one lowpass filter for the I downconverted signal and another lowpass filter for the Q downconverted signal. Similarly, amplifiers 544 may include one amplifier for the I filtered signal and another amplifier for the Q filtered signal. Receive circuits 240 may also include other circuits.

In the design shown in FIG. 5, data processor 290 includes analog-to-digital converters (ADCs) 592 and phase corrector 294. ADCs 592 digitize the I and Q baseband signals from receive circuits 240 and provide I and Q samples. Phase corrector 294 processes the I and Q samples based on the detected phase of the LO signal to account for phase discontinuity of the LO signal and provides phase-corrected I and Q samples. Phase corrector 294 may also include a phase detection function in the absence of a separate phase detector 250. Phase corrector 294 may be omitted if phase corrector 266 is present and provides phase-corrected ILO and QLO signals to downconverter 230. Data processor 290 may include other circuits to process the phase-corrected I and Q samples to recover data sent to wireless device 110.

In one design, receiver 220 may operate in a receive mode or a calibration mode at any given moment. In the receive mode, LNA 222 is enabled and provides an amplified RF signal to downconverter 230. Buffer 576 is disabled and does not provide a single-tone signal. The entire single tone generator 270 may also be disabled in receive mode. Downconverter 230 downconverts the amplified RF signal with the LO signal from LO generator 260 and provides I and Q downconverted signals to receive circuits 240.

In the calibration mode, single tone generator 270 and buffer 576 may be enabled and may provide a single-tone signal via coupling circuit 224 to downconverter 230. Coupling circuit 224 may be located between LNA 222 and downconverter 230, as shown in FIG. 5. In this case, LNA 222 may be disabled and would not provide an amplified RF signal in the calibration mode. Alternatively, the single-tone signal may be provided to the input of LNA 222 via a switch, as shown by the dashed line from single-tone generator 270 to LNA 222 in FIG. 5. The switch (not shown in FIG. 5) may isolate the input RF signal from the single-tone signal. In any case, downconverter 230 downconverts the single-tone signal with the LO signal from LO generator 260 and provides I and Q downconverted signals to phase detector 250.

In the design shown in FIG. 5, phase detector 250 includes lowpass filters 552a and 552b and a phase detection circuit 554. Lowpass filter 552a filters the I downconverted signal and provides a differential I filtered signal comprising Ip and In signals. Lowpass filter 552b filters the Q downconverted signal and provides a differential Q filtered signal comprising Qp and Qn signals. Lowpass filters 552 may provide sufficient gain so that phase detection circuit 554 can operate properly. In one design, lowpass filters 552a and 552b have similar characteristics (e.g., similar bandwidth) as lowpass filters 542 in receive circuits 540. In another design, lowpass filters 552a and 552b have different characteristics (e.g., different bandwidth) from lowpass filters 542. Phase detection circuit 554 receives the reference signal and the differential I and Q filtered signals and detects the phases of the Ip, In, Qp and Qn signals at a reference time. Phase detection circuit 554 determines the phase of the LO signal at the reference time based on the detected phases of the Ip, In, Qp and Qn signals, as described below. Phase detection circuit 554 provides the detected phase of the LO signal to data processor 290.

If phase corrector 294 is not present, then phase detector 250 may be used to control phase corrector 266. Alternatively, phase corrector 294 may include phase detection function, and both phase detector 250 and phase detector 266 may be omitted.

A divider (e.g., a divide-by-2 divider) may operate non-continuously and may be enabled by an enable signal. The enable signal may not be synchronized with a VCO signal provided to the divider, since extra battery power would be consumed to operate a high-speed synchronization circuit to generate a synchronized enable signal for the divider. If the enable signal of the divider is time-aligned with (or is slightly before) a first rising edge of the VCO signal, then the ILO phase may be considered to be in phase with the VCO signal. However, if the enable signal is later than the first rising edge of the VCO signal but is time-aligned with (or is slightly before) a second rising edge of the VCO signal, then the phase of the ILO signal from the divider is delayed by 180 degrees whereas the phase of the VCO signal is delayed by 360 degrees, which would wrap around to zero degrees. Unless the enable signal of the divider is synchronized with the VCO signal, the ILO signal from the divider may have a phase of either 0 or 180 degrees. In general, for a divide-by-N divider which does not have a synchronized enable signal, the phase of an output signal from the divider may randomly be 0, $2\pi/N, \ldots, 2\pi*(N-1)/N$ radians.

In general, the time when a divider wakes up may affect the phases of the I and Q downconverted signals. The phases of the I and Q downconverted signals may be detected at known reference times. Phase discontinuity of the LO signal may be determined based on the detected phases of the I and Q downconverted signals at the known reference times.

FIGS. 6A and 6B show a design of performing phase detection for a divide-by-2 divider with two possible states. The phases of the Ip, In, Qp and Qn signals from lowpass filters 552a and 552b may be detected at known reference times, which may be a suitable amount of time prior to the start of downlink subframes. In the calibration mode, LO generator 260 and single-tone generator 270 are both locked to the reference signal, and the frequencies of the LO signal and the single-tone signal are known. The downconverted I and Q signals include components at a sum frequency of $f_{LO}+f_{ST}$ and a difference frequency of $f_{LO}+f_{ST}$, as described above. Lowpass filters 552a and 552b pass the signal component at the difference frequency and attenuate the signal component at the sum frequency. The filtered I and Q signals thus include the signal component at the difference frequency of $f_{LO}-f_{ST}$. The frequency of the single-tone signal may be selected such that there is an integer number of cycles of the filtered I and Q signals at the difference frequency between two consecutive reference times. In this case, the filtered I and Q signals should have the same phase at each reference time if there is no phase discontinuity in the LO signal.

FIG. 6A shows case 1 corresponding to the divide-by-2 divider being in a first state at a reference time T1. The Ip, In, Qp and Qn signals provided to phase detection circuit 554 as well as digital samples corresponding to these signals are shown in FIG. 6A. For each signal, a leading/rising transition (which may also be referred to as the zero crossing) occurs when the corresponding digital samples changes from '0' to '1'. The phase of each signal is given by the amount of time from the reference time to the first leading transition of the signal after the reference time. The phase of each signal may be given by an integer number of cycles of the reference signal. In the example shown in FIG. 6A, the Ip signal has a phase of $\Phi_{Ip}=1$, the Qp signal has a phase of $\Phi_{Qp}=3$, the In signal has a phase of $\Phi_{In}=6$, and the Qn signal has a phase of $\Phi_{Qn}=8$. For case 1, the Ip signal leads the Qp signal, the In signal leads the Qn signal, and $\Phi_{Ip}<\Phi_{Qp}<\Phi_{In}<\Phi_{Qn}$.

FIG. 6B shows case 2 corresponding to the divide-by-2 divider being in a second state at a reference time T2. The Ip, In, Qp and Qn signals provided to phase detection circuit 554 as well as digital samples corresponding to these signals are shown in FIG. 6B. In the example shown in FIG. 6B, the In signal has a phase of $\Phi_{In}=1$, the Qn signal has a phase of $\Phi_{Qn}=3$, the Ip signal has a phase of $\Phi_{Ip}=6$, and the Qp signal has a phase of $\Phi_{Qp}=8$. For case 2, the In signal lead the Ip signal, the Qn signal lead the Qp signal, and $\Phi_{In}<\Phi_{Qn}<\Phi_{Ip}<\Phi_{Qp}$. The Ip and In signals may be swapped (e.g., by phase corrector 266 in FIG. 5), and the Qp and Qn signals may also be swapped. The swapped Ip, In, Qp and Qn signals in case 2 would resemble the Ip, In, Qp and Qn signals in case 1.

FIGS. 6A and 6B show timing diagrams illustrating different phases of the I and Q filtered signals due to phase discontinuity of a divide-by-2 divider. A divide-by-N divider would include more than two cases, with each case corresponding to a different divider state. Each case is associated with a different set of phases for the I and Q signals. The phases of the I and Q signals may be determined relative to a reference time and may be used to detect the phase of the LO signal.

In one design, phase estimation may be performed by cross-correlating digital samples for a previous phase measurement interval (or previous STG tone samples) against digital samples for a current phase measurement interval (or current STG tone samples). The previous and current phase measurement intervals may correspond to two downlink intervals (e.g., timeslots or subframes) during which phase estimation is performed. A phase change between the previous and current phase measurement intervals may be estimated based on the cross-correlation results. The phase change may include (i) phase discontinuity due to a divider being in different states in the previous and current phase measurement intervals and (ii) phase change due to drift in circuits and/or other phenomena. The phase change may be within a range of 0 to $2\pi$ radians. The estimated phase change may be compensated in the analog domain or the digital domain in order to maintain phase continuity.

Referring back to FIG. 5, phase detector 250 detects the phase of the LO signal based on the I and Q downconverted signals from downconverter 230, e.g., as described above for FIGS. 6A and 6B. Phase detector 250 provides the detected phase of the LO signal to data processor 290 and/or other circuits in receiver 220. The detected phase may be indicative of relative phase information for the ILO and QLO signals from LO generator 260.

In one design, phase corrector 266 may swap the ILO and QLO signals to account for phase discontinuity of the LO signal due to divider 264. In another design, phase correction circuit 294 may rotate (e.g., swap and/or invert) the I and Q samples from ADCs 592 to account for phase discontinuity of the LO signal due to divider 264. In yet another design, phase correction circuit 294 may compensate for an estimated phase change, which may be within a range of 0 to 2π radians. For example, phase correction circuit 294 may implement a cordic rotator/processor/multiplier that can rotate the phase of a complex signal by any desired amount for phase compensation. Phase discontinuity of the LO signal may also be accounted for in other manners. The phase of the downconverted signal in a current subframe may be rotated, if needed, so that it is continuous with the phase of the downconverted signal in a prior subframe (e.g., the phase is the same as in the previous subframe). This maintains phase continuity and improves throughput.

The techniques for detecting the phase of an LO signal using a single-tone signal may be used for wireless devices communicating with various wireless systems utilizing TDD. For example, the techniques may be used for wireless devices in LTE TDD systems, TD-SCDMA systems, etc. Different wireless systems may utilize different frame structures to support TDD.

Figure 7A:
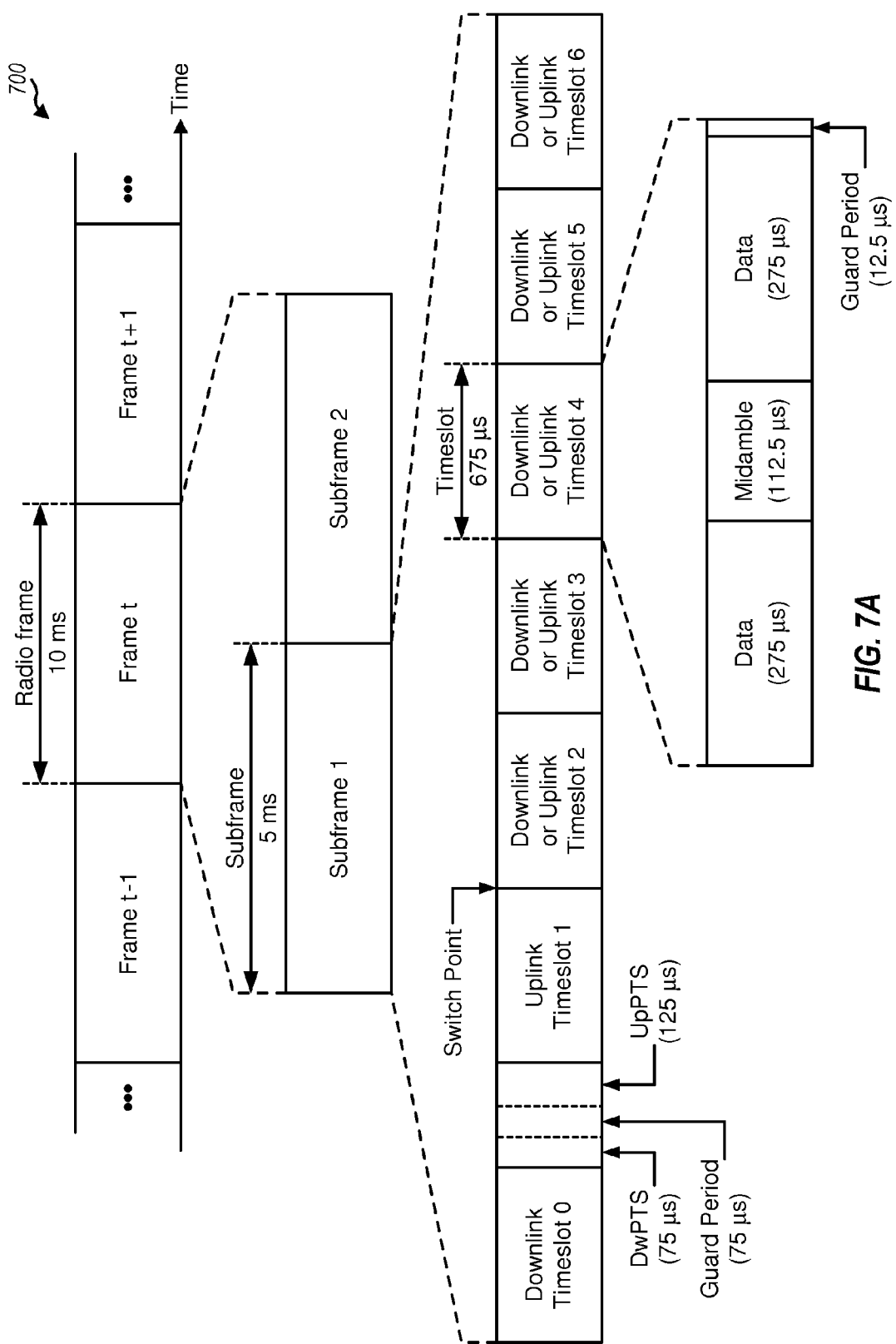
FIGS. 7A and 7B show two exemplary frame structures.

FIG. 7A shows an exemplary frame structure 700 for TD-SCDMA. The transmission time line is partitioned into frames, with each frame being identified by a system frame number (SFN). Each frame has a duration of 10 milliseconds (ms) and is partitioned into two subframes 1 and 2. Each subframe has a duration of 5 ms and is partitioned into seven timeslots 0 through 6, a Downlink Pilot Time Slot (DwPTS), an Uplink Pilot Time Slot (UpPTS), and a guard period (GP). The DwPTS, the guard period, and the UpPTS are located after timeslot 0. Timeslot 0 is used for the downlink, timeslot 1 is used for the uplink, and timeslots 2 through 6 may each be used for the downlink or uplink, as determined by a switch point. Each timeslot has a duration of 675 micro-second (μs) (or 864 chips). The DwPTS has a duration of 75 μs (or 96 chips), and the UpPTS has a duration of 125 μs (or 160 chips). The guard period is located between the DwPTS and the UpPTS and has a duration of 75 μs (or 96 chips).

For TD-SCDMA, each timeslot includes a first data portion, a midamble, a second data portion, and a guard period. Each data portion has a duration of 275 μs (or 352 chips), and the midamble has a duration of 112.5 μs (or 144 chips). The guard period is located at the end of the timeslot and has a duration of 12.5 μs (or 16 chips). Each timeslot may be assigned to one or multiple users for data transmission.

Figure 7B:
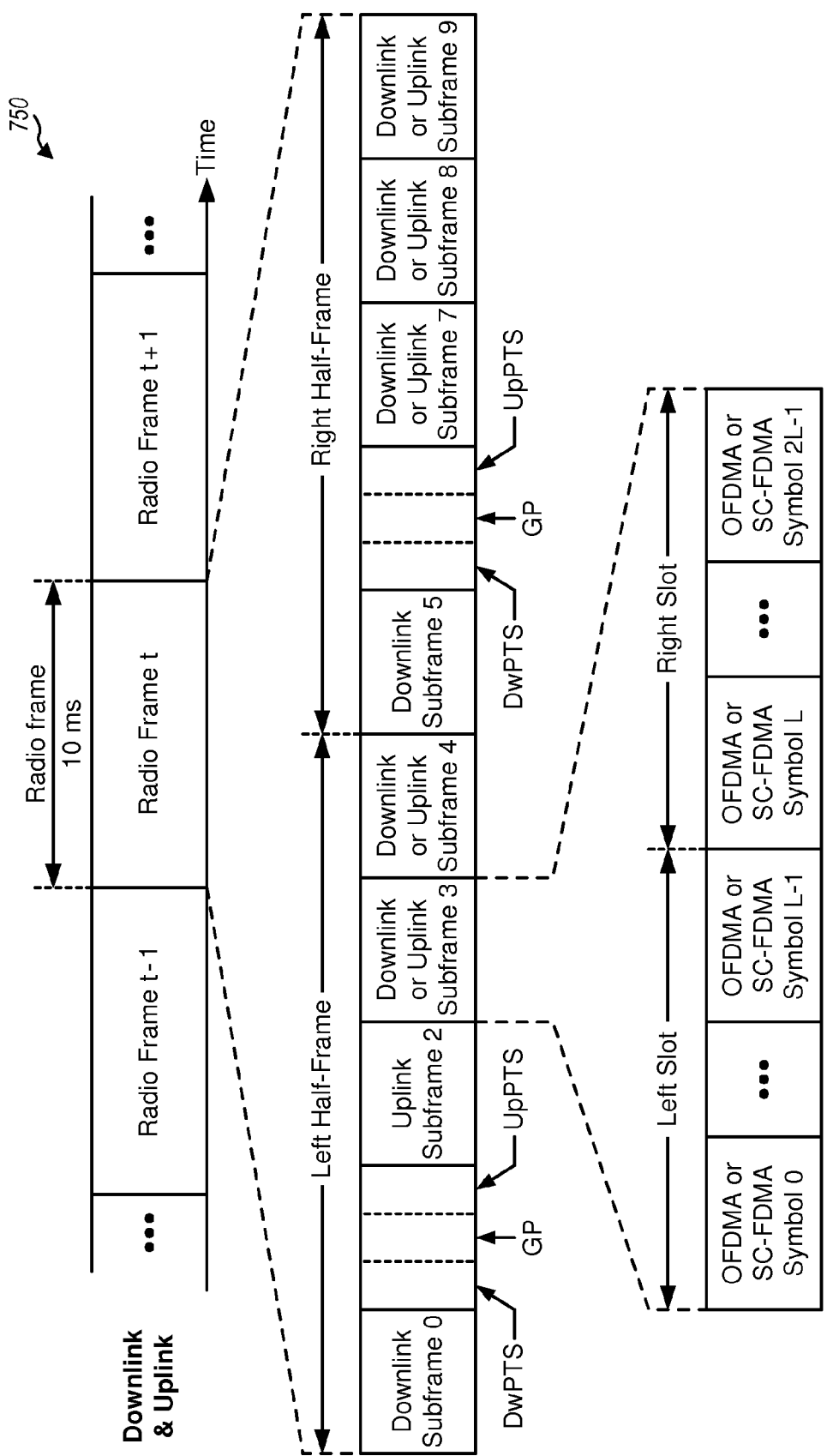

FIG. 7B shows an exemplary frame structure 750 for LTE TDD. The transmission timeline is partitioned into units of radio frames, with each radio frame having a duration of 10 ms. Each radio frame is partitioned into 10 subframes with indices of 0 through 9. LTE supports a number of uplink-downlink configurations for TDD. Subframes 0 and 5 are used for the downlink and subframe 2 is used for the uplink for all uplink-downlink configurations. Subframes 3, 4, 7, 8 and 9 may each be used for the downlink or uplink depending on the uplink-downlink configuration. Subframe 1 includes three special fields composed of a DwPTS used for downlink control channels as well as data transmission, a Guard Period (GP) of no transmission, and an UpPTS used for either a random access channel (RACH) or a sounding reference signals (SRS). Subframe 6 may include only the DwPTS, or all three special fields, or a downlink subframe depending on the uplink-downlink configuration. The DwPTS, the guard period, and the UpPTS may have different durations for different subframe configurations. The DwPTS may have a duration between 214 and 857 μs. The UpPTS may have a duration between 71 and 142 μs. The guard period may have a duration between 71 and 714 μs.

As shown in FIGS. 7A and 7B, TD-SCDMA systems and LTE TDD systems have fast switching between downlink timeslots and uplink timeslots. For example, within a subframe in a TD-SCDMA system shown in FIG. 7A, downlink-to-uplink transition may occur within the 75 μs guard period after timeslot 0, and uplink-to-downlink transition may occur within the 12.5 μs guard period at the end of a timeslot.

In general, in TDD systems, some subframes may be used for the downlink and may be referred to as downlink subframes. The remaining subframes may be used for the uplink and may be referred to as uplink subframes. Wireless device 110 may disable as much receiver circuitry as possible during uplink subframes in order to conserve battery power. Wireless device 110 may also disable as much transmitter circuitry as possible during downlink subframes in order to conserve battery power.

As shown in FIGS. 7A and 7B, a receiver may be active during only some time intervals, and a transmitter may be active during some other time intervals for communication with a wireless system utilizing TDD. In particular, the receiver may be active during downlink timeslots in a TD-SCDMA system or downlink subframes in an LTE TDD system. The transmitter may be active during uplink timeslots in a TD-SCDMA system or uplink subframes in an LTE TDD system. To conserve battery power and possibly improve performance, frequency synthesizer 262 may be enabled only when the receiver is active and may be disabled at other times.

Figure 8A:
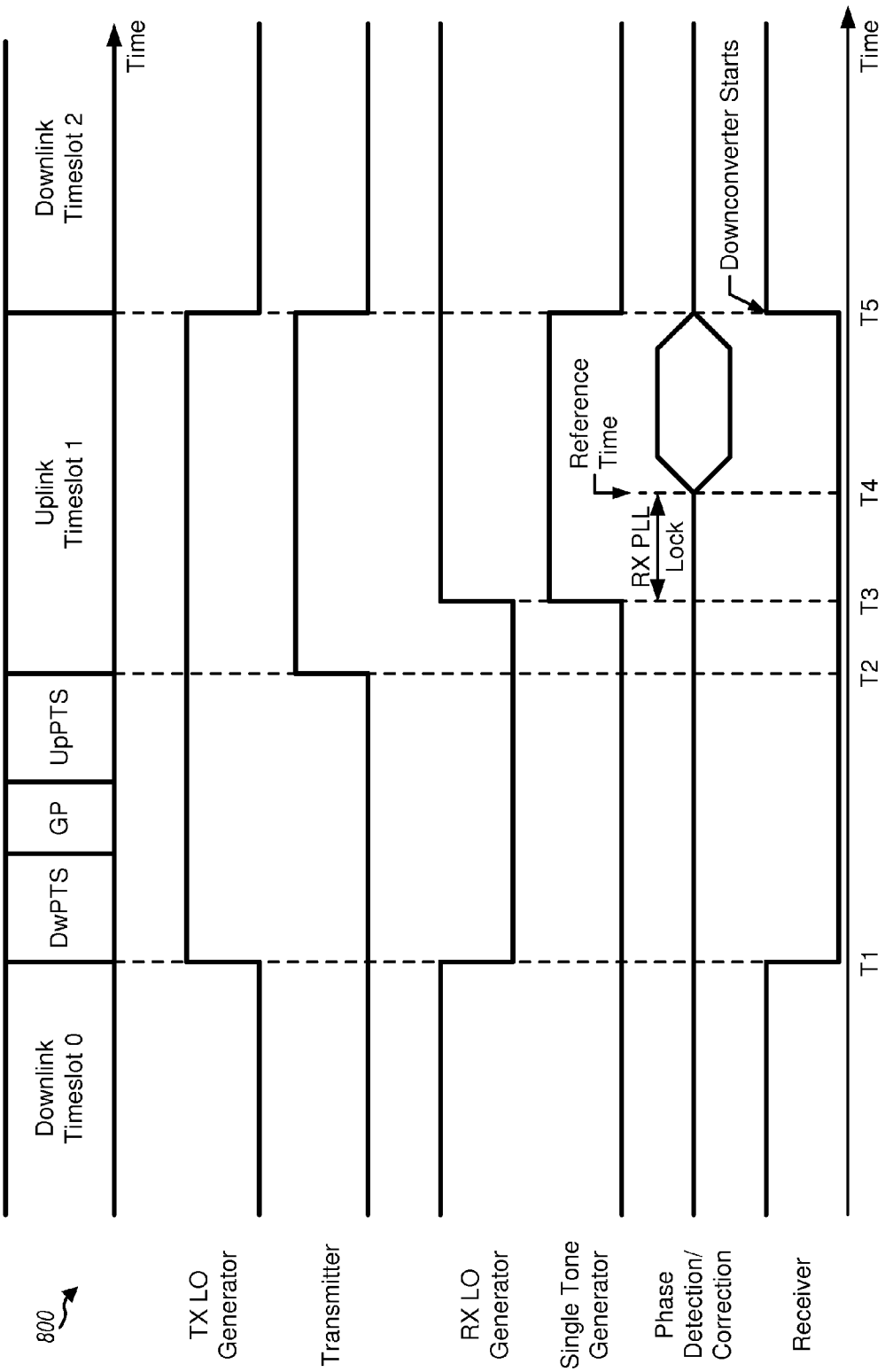
FIGS. 8A and 8B show two exemplary phase calibration timelines.

FIG. 8A shows an exemplary power-on and phase calibration timeline 800 for RX LO generator 260 and TX LO generator 288 at wireless device 110 in FIG. 2 for TD-SCDMA. For data transmission on the uplink, TX LO generator 288 is (i) enabled at the start of the DwPTS at time T1 and (ii) disabled at the end of timeslot 1 for the uplink at time T5. Transmitter 280 is (i) enabled prior to the start of timeslot 1 at time T2 and (ii) disabled at the end of timeslot 1 for the uplink at time T5.

For data reception on the downlink, RX LO generator 260 is (i) disabled at the end of timeslot 0 for the downlink at time T1 and (ii) enabled prior to the start of timeslot 2 for the downlink at time T3. Single-tone generator 270 is (i) enabled at time T3 and (ii) disabled at the start of timeslot 2 for the downlink at time T5. Downconverter 230 is also enabled at time T3. PLL 582 within RX LO generator 260 attempts to lock to the reference signal starting at time T3 and achieves lock at time T4. Phase detection and correction are performed starting at time T4 once PLL lock is achieved for RX LO generator 260. The phase of the LO signal from RX LO generator 260 is detected and phase discontinuity (if any) is corrected by phase corrector 266 or phase correction circuit 294 in FIG. 5 prior to T5. Receiver 220 is (i) disabled at the end of timeslot 0 for the downlink at time T1 and (ii) enabled prior to the start of timeslot 2 for the downlink at time T5.

Figure 8B:
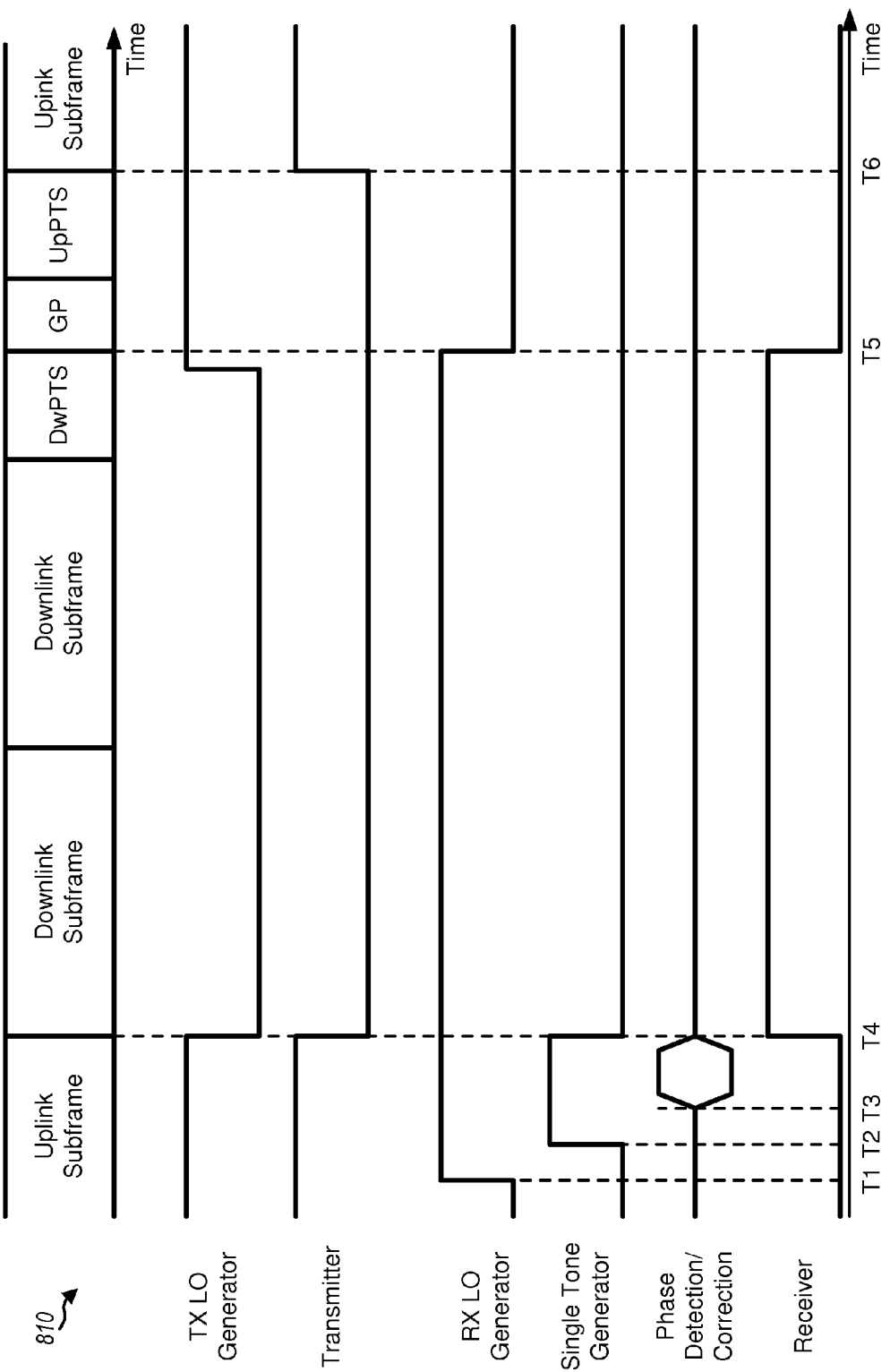

FIG. 8B shows an exemplary power-on and phase calibration timeline 810 for RX LO generator 260 and TX LO generator 288 at wireless device 110 in FIG. 2 for LTE. For data transmission on the uplink, TX LO generator 288 is (i) enabled sufficiently early prior to a first uplink subframe (e.g., at time T5) scheduled for data transmission and (ii) disabled at the end of a last uplink subframe (e.g., at time T4) scheduled for data transmission. Transmitter 280 is (i) enabled at the start of the first uplink subframe (e.g., at time T6) and (ii) disabled at the end of the last uplink subframe (e.g., at time T4).

For data reception on the downlink, RX LO generator 260 is (i) enabled sufficiently early prior to a first downlink subframe (e.g., at time T1) scheduled for data transmission and (ii) disabled after the end of a last downlink subframe (e.g., at time T5) scheduled for data transmission. Single-tone generator 270 is (i) enabled sufficiently early prior to the start of the first downlink subframe (e.g., at time T2) and (ii) disabled at the start of the first downlink (e.g., at time T4). Downconverter 230 is also enabled at time T2. PLL 582 within RX LO generator 260 attempts to lock to the reference signal starting at time T2 and achieves lock at time T3. Phase detection and correction are performed starting at time T3 once PLL lock is achieved for RX LO generator 260. The phase of the LO signal from RX LO generator 260 is detected and phase discontinuity (if any) is corrected by phase corrector 266 or phase correction circuit 294 in FIG. 5 prior to time T4. Receiver 220 is (i) enabled prior to the start of the first downlink subframe (e.g., at time T4) and (ii) disabled at the end of the last downlink subframe (e.g., at time T5).

As shown in FIGS. 8A and 8B, RX LO generator 260 and divider 264 may be powered on during downlink intervals (e.g., timeslots or subframes) to generate the LO signal for data reception. RX LO generator 260 and divider 264 may be powered off during uplink intervals (e.g., timeslots or subframes).

In the design shown in FIGS. 8A and 8B, phase detection and correction/calibration are performed during an uplink timeslot or subframe. Single-tone generator 270 is used as an RF signal source for downconverter 230 to assist phase detection of the LO signal from RX LO generator 260 and phase calibration of the LO path. Single tone generator 270 and PLL 582 within RX LO generator 260 are enabled prior to the first downlink timeslot or subframe for phase detection and correction and are disabled after phase detection and correction are completed.

FIGS. 8A and 8B show two exemplary designs of a power-on and phase calibration timeline for TD-SCDMA and LTE, respectively. In general, phase calibration may be performed for an LO generator prior to a designated time at which an LO signal from the LO generator is needed. The LO generator and a single-tone generator may be enabled prior to the designated time by a sufficient amount of time in order to (i) allow a PLL within the LO generator to achieve lock and (ii) allow a phase detector to determine the phase of the LO signal. Phase correction may be performed in the analog domain (e.g., by swapping and/or inverting ILO and QLO signals) or in the digital domain (e.g., by rotating I and Q samples) prior to the designated time.

In an exemplary design, an apparatus (e.g., a wireless device, an IC, a circuit module, etc.) may include an LO generator and a phase detector. The LO generator (e.g., LO generator 260 in FIGS. 2 and 5) may generate an LO signal used for frequency conversion and may be periodically powered on and off. For example, the LO generator may be powered on prior to time intervals for downlink reception and may be powered off during at least part of time intervals for uplink transmission (e.g., as shown in FIGS. 8A and 8B). The LO generator may thus be powered on or off frequently, but not necessarily based on a fixed schedule. The phase detector (e.g., phase detector 250 in FIGS. 2 and 5) may detect the phase of the LO signal when the LO generator is powered on. The detected phase of the LO signal may be used to identify phase discontinuity of the LO signal.

The apparatus may further include a single-tone generator (e.g., single-tone generator 270 in FIGS. 2 and 5), which may generate a single-tone signal used to detect the phase of the LO signal when the LO generator is powered on. The LO signal may have non-continuous phase, and the single-tone signal may have continuous phase. In one design, the single-tone generator may include an oscillator and a PLL. The oscillator (e.g., VCO 574 in FIG. 5) may generate an oscillator signal used to derive the single-tone signal. The PLL (e.g., PLL 572 in FIG. 5) may receive a reference signal and the oscillator signal and may generate a control signal for the oscillator. The LO generator may generate the LO signal at a first frequency, which may be dependent on a downlink signal being received. The single-tone generator may generate the single-tone signal at a second frequency that is different from the first frequency.

In one design, the LO generator may include a frequency synthesizer and a divider. The frequency synthesizer (e.g., frequency synthesizer 262 in FIG. 5) may receive the reference signal and provide an oscillator signal. The divider (e.g., divider 264 in FIG. 5) may divide the oscillator signal in frequency and provide the LO signal. The divider may operate in different states corresponding to different transition edges of the oscillator signal at powered on. The time at which the divider is powered on may not be synchronized with the rising (or falling) edges of the oscillator signal. The phases of the LO signal may not be time-aligned to the same rising (or falling) edge of the oscillator signal. The phase detection and correction can account for the different states of the divider at different wake-up times.

The apparatus may further include a downconverter (e.g., downconverter 230 in FIGS. 2 and 3). The downconverter may downconvert an amplified RF signal from an LNA with the LO signal in a receive mode. The downconverter may downconvert the single-tone signal with the LO signal and provide a downconverted signal in a calibration mode. The phase detector may detect the phase of the LO signal based on the downconverted signal.

In one design, the phase detector may include at least one lowpass filter and a phase detection circuit. The at least one lowpass filter (e.g., lowpass filters 552a and 552b in FIG. 5) may receive the downconverted signal from the downconverter and provide a filtered signal comprising four signals that are 90 degrees out of phase. The phase detection circuit (e.g., phase detection circuit 554 in FIG. 5) may detect the phases of the four signals and may determine the phase of the LO signal based on the detected phases of the four signals (e.g., as shown in FIGS. 6A and 6B). Phase detection may be performed at a reference time when a target phase of the LO signal is known.

The apparatus may further include a phase corrector, which may correct phase discontinuity of the LO signal based on the detected phase of the LO signal. The LO signal from the LO generator may comprise four signals (e.g., ILOp, ILOn, QLOp and QLOn signals) that are 90 degrees out of phase. In one design, the phase corrector (e.g., phase corrector 266 in FIG. 5) may swap and/or invert the four signals of the LO signal to correct phase discontinuity of the LO signal. In another design, the phase corrector (e.g., phase corrector 294 in FIG. 5) may rotate I and Q samples obtained from the downconverted signal to correct phase discontinuity of the LO signal. In yet another design, the phase detector may detect a phase change between two time intervals. The phase corrector may compensate the detected phase change in order to correct any phase discontinuity of the LO signal.

Figure 9:
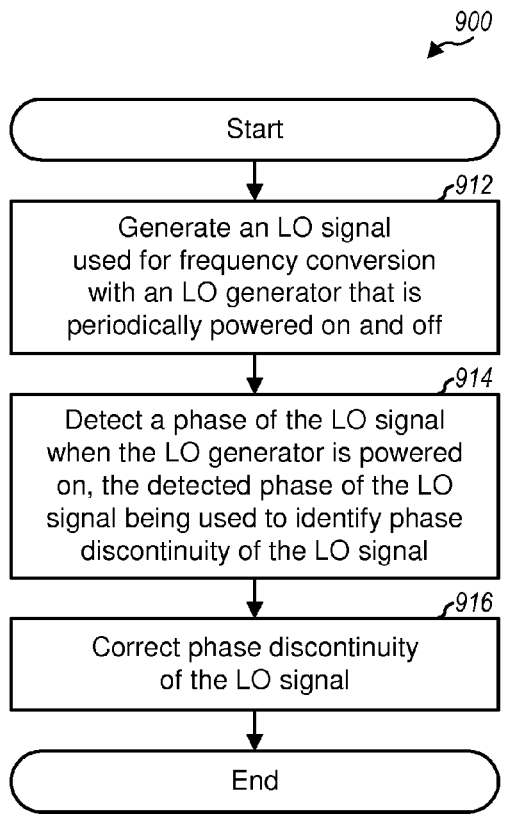
FIG. 9 shows a process for generating an LO signal.

FIG. 9 shows an exemplary design of a process 900 for generating an LO signal. An LO signal used for frequency conversion may be generated with an LO generator that is periodically powered on and off (block 912). The phase of the LO signal may be detected when the LO generator is powered on, and the detected phase of the LO signal may be used to identify phase discontinuity of the LO signal (block 914). Phase discontinuity of the LO signal may be corrected (block 916).

Figure 10:
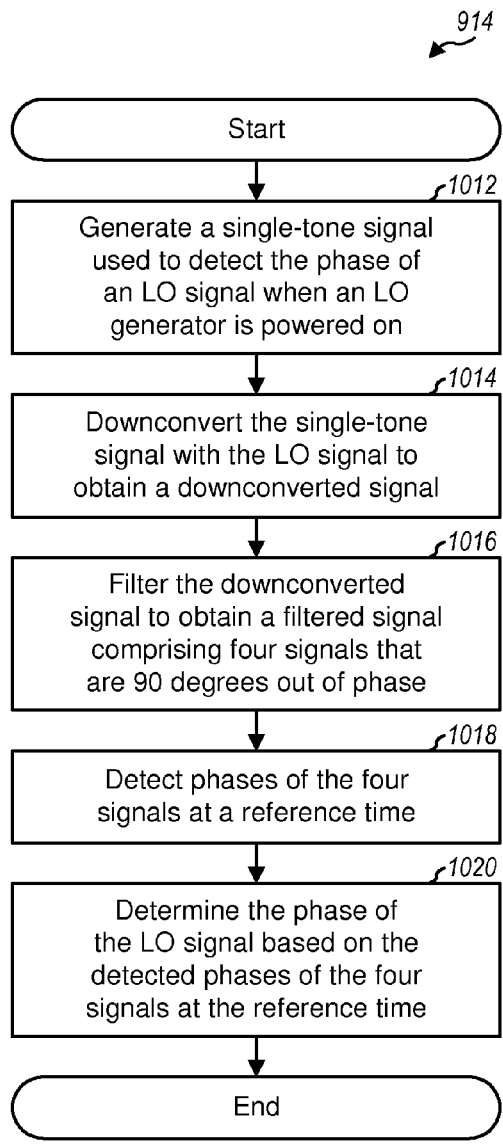
FIG. 10 shows a process for determining the phase of an LO signal using a single-tone generator.

FIG. 10 shows an exemplary design of block 914 in FIG. 9. A single-tone signal may be used to detect the phase of the LO signal and may be generated when the LO generator is powered on (block 1012). The single-tone signal may be downconverted with the LO signal to obtain a downconverted signal, e.g., in a calibration mode (block 1014). The phase of the LO signal may be detected based on the downconverted signal. In one design, the downconverted signal may be filtered to obtain a filtered signal comprising four signals that are 90 degrees out of phase (block 1016). The phases of the four signals may be detected at a reference time at which a target phase of the LO signal is known (block 1018). The phase of the LO signal may then be determined based on the detected phases of the four signals at the reference time (block 1020).

Referring back to FIG. 9, in one design of block 916, four signals that are 90 degrees out of phase may be obtained for the LO signal and may be swapped to correct phase discontinuity of the LO signal. In another design of block 916, I and Q samples may be obtained by downconverting an amplified RF signal with the LO signal (e.g., in a receive mode) and may be rotated to correct phase discontinuity of the LO signal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus comprising:
 a local oscillator (LO) generator configured to generate an LO signal used for frequency conversion, the LO generator being periodically powered on and off; and
 a phase detector configured to detect a phase of the LO signal when the LO generator is powered on, the detected phase of the LO signal being used to identify phase discontinuity of the LO signal, wherein the phase detector is further configured to:
 compare digital samples for a first measurement interval with digital samples for a second measurement interval; and determine a phase change between the first and second measurement interval based on the comparison results of the digital samples.

2. The apparatus of claim 1, further comprising:
a single-tone generator configured to generate a single-tone signal used to detect the phase of the LO signal when the LO generator is powered on.

3. The apparatus of claim 2, the single-tone generator comprising:
an oscillator configured to generate an oscillator signal used to derive the single-tone signal; and
a phase locked loop (PLL) configured to receive a reference signal and the oscillator signal and generate a control signal for the oscillator.

4. The apparatus of claim 2, the LO generator being configured to generate the LO signal at a first frequency, and the single-tone generator being configured to generate the single-tone signal at a second frequency different from the first frequency.

5. The apparatus of claim 2, the LO generator being configured to generate the LO signal at a first frequency, and the single-tone generator being configured to generate the single-tone signal at a plurality of frequencies different from the first frequency.

6. The apparatus of claim 2, further comprising:
a downconverter configured to downconvert the single-tone signal with the LO signal and provide a downconverted signal, the phase detector being configured to detect the phase of the LO signal based on the downconverted signal.

7. The apparatus of claim 2, wherein the single-tone generator is enabled during calibration of the LO generator and is disabled when calibration is completed.

8. The apparatus of claim 1, the LO generator comprising:
a frequency synthesizer configured to receive a reference signal and provide an oscillator signal, and
a divider configured to divide the oscillator signal in frequency and provide the LO signal.

9. The apparatus of claim 8, the divider being in one of a plurality of possible states upon being powered on, and the plurality of possible states of the divider being associated with different phases of the LO signal.

10. The apparatus of claim 1, wherein the detected phase of the LO signal is within a range of 0 to 2 pi radians.

11. The apparatus of claim 1, further comprising:
a phase corrector configured to correct phase discontinuity of the LO signal based on the detected phase of the LO signal.

12. The apparatus of claim 11, the LO signal comprising four signals that are 90 degrees out of phase, and the phase corrector being configured to swap the four signals of the LO signal to correct phase discontinuity of the LO signal.

13. The apparatus of claim 11, the phase corrector configured to rotate inphase (I) and quadrature (Q) samples obtained from a downconverted signal to correct phase discontinuity of the LO signal.

14. The apparatus of claim 11, the phase detector configured to detect a phase change between two time intervals, and the phase corrector configured to compensate the detected phase change to correct phase discontinuity of the LO signal.

15. The apparatus of claim 1, the LO generator being powered on prior to time intervals for downlink reception and being powered off during at least part of time intervals for uplink transmission.

16. An apparatus comprising:
a local oscillator (LO) generator configured to generate an LO signal used for frequency conversion, the LO generator being periodically powered on and off;
a phase detector configured to detect a phase of the LO signal when the LO generator is powered on, the detected phase of the LO signal being used to identify phase discontinuity of the LO signal;
a single-tone generator configured to generate a single-tone signal used to detect the phase of the LO signal when the LO generator is powered on; and
a downconverter configured to downconvert the single-tone signal with the LO signal and provide a downconverted signal, the phase detector being configured to detect the phase of the LO signal based on the downconverted signal and the downconverter being further configured to downconvert the single-tone signal with the LO signal in a calibration mode and to downconvert an amplified radio frequency (RF) signal from a low noise amplifier (LNA) with the LO signal in a receive mode.

17. An apparatus comprising:
a local oscillator (LO) generator configured to generate an LO signal used for frequency conversion, the LO generator being periodically powered on and off;
a phase detector configured to detect a phase of the LO signal when the LO generator is powered on, the detected phase of the LO signal being used to identify phase discontinuity of the LO signal;
a single-tone generator configured to generate a single-tone signal used to detect the phase of the LO signal when the LO generator is powered on; and
a downconverter configured to downconvert the single-tone signal with the LO signal and provide a downconverted signal, the phase detector being configured to detect the phase of the LO signal based on the downconverted signal, the phase detector comprising:
at least one lowpass filter configured to receive the downconverted signal from the downconverter and provide a filtered signal comprising four signals that are 90 degrees out of phase; and
a phase detection circuit configured to detect the phases of the four signals and determine the phase of the LO signal.

18. The apparatus of claim 17, the phase detection circuit being configured to detect the phases of the four signals at a reference time at which a target phase of the LO signal is known.

19. A method of generating a local oscillator (LO) signal, comprising:
generating an LO signal, used for frequency conversion, with an LO generator that is periodically powered on and off; and
detecting a phase of the LO signal when the LO generator is powered on, the detected phase of the LO signal being used to identify phase discontinuity of the LO signal, wherein the detecting the phase of the LO signal comprises:
compare digital samples for a first measurement interval with digital samples for a second measurement interval; and
determining a phase change between the first and second measurement interval based on the comparison results of the digital samples.

20. The method of claim 19, further comprising:
generating a single-tone signal used to detect the phase of the LO signal when the LO generator is powered on.

21. The method of claim 20, further comprising:
downconverting the single-tone signal with the LO signal to obtain a downconverted signal, and wherein the detecting the phase of the LO signal comprises detecting the phase of the LO signal based on the downconverted signal.

22. The method of claim 19, wherein the LO signal comprises four signals that are 90 degrees out of phase, the method further comprising:
swapping the four signals of the LO signal to correct phase discontinuity of the LO signal.

23. The method of claim 19, further comprising:
downconverting an amplified radio frequency (RF) signal with the LO signal to obtain a downconverted signal;
generating inphase (I) and quadrature (Q) samples based on the downconverted signal; and
rotating the I and Q samples to correct phase discontinuity of the LO signal.

24. The method of claim 19, further comprising:
powering on the LO generator prior to time intervals for downlink reception; and
powering off the LO generator during at least part of time intervals for uplink transmission.

25. A method of generating a local oscillator (LO) signal, comprising:
generating an LO signal, used for frequency conversion, with an LO generator that is periodically powered on and off;
detecting a phase of the LO signal when the LO generator is powered on, the detected phase of the LO signal being used to identify phase discontinuity of the LO signal;
generating a single-tone signal used to detect the phase of the LO signal when the LO generator is powered on; and
downconverting the single-tone signal with the LO signal to obtain a downconverted signal, wherein the detecting the phase of the LO signal comprises detecting the phase of the LO signal based on the downconverted signal and wherein the detecting the phase of the LO signal based on the downconverted signal comprises:
filtering the downconverted signal to obtain a filtered signal comprising four signals that are 90 degrees out of phase,
detecting phases of the four signals at a reference time, and
determining the phase of the LO signal based on the detected phases of the four signals at the reference time.

26. A method of generating a local oscillator (LO) signal, comprising:
generating an LO signal, used for frequency conversion, with an LO generator that is periodically powered on and off;
detecting a phase of the LO signal when the LO generator is powered on, the detected phase of the LO signal being used to identify phase discontinuity of the LO signal;
generating a single-tone signal used to detect the phase of the LO signal when the LO generator is powered on;
downconverting the single-tone signal with the LO signal in a calibration mode; and
downconverting an amplified radio frequency (RF) signal with the LO signal in a receive mode.

27. An apparatus for wireless communication, comprising:
means for generating a local oscillator (LO) signal used for frequency conversion, the means for generating being periodically powered on and off; and
means for detecting a phase of the LO signal when the means for generating is powered on, the detected phase of the LO signal being used to identify phase discontinuity of the LO signal, wherein the means for detecting the phase of the LO signal is further configured to:
compare digital samples for a first measurement interval with digital samples for a second measurement interval; and
determine a phase change between the first and second measurement interval based on the comparison results of the digital samples.

28. The apparatus of claim 27, further comprising:
means for generating a single-tone signal used to detect the phase of the LO signal when the means for generating is powered on.

29. The apparatus of claim 28, further comprising:
means for downconverting the single-tone signal with the LO signal to obtain a downconverted signal, and wherein the means for detecting the phase of the LO signal comprises means for detecting the phase of the LO signal based on the downconverted signal.

30. The apparatus of claim 27, further comprising:
means for correcting phase discontinuity of the LO signal based on the detected phase of the LO signal.

31. The apparatus of claim 27, further comprising:
means for powering on the means for generating prior to time intervals for downlink reception; and
means for powering off the means for generating during at least part of time intervals for uplink transmission.

32. An apparatus for wireless communication, comprising:
means for generating a local oscillator (LO) signal used for frequency conversion, the means for generating being periodically powered on and off;
means for detecting a phase of the LO signal when the means for generating is powered on, the detected phase of the LO signal being used to identify phase discontinuity of the LO signal;
means for generating a single-tone signal used to detect the phase of the LO signal when the means for generating is powered on; and
means for downconverting the single-tone signal with the LO signal to obtain a downconverted signal, wherein the means for detecting the phase of the LO signal comprises means for detecting the phase of the LO signal based on the downconverted signal and wherein the means for detecting the phase of the LO signal based on the downconverted signal comprises:
means for filtering the downconverted signal to obtain a filtered signal comprising four signals that are 90 degrees out of phase,
means for detecting phases of the four signals at a reference time, and
means for determining the phase of the LO signal based on the detected phases of the four signals at the reference time.

33. An apparatus for wireless communication, comprising:
means for generating a local oscillator (LO) signal used for frequency conversion, the means for generating being periodically powered on and off;
means for detecting a phase of the LO signal when the means for generating is powered on, the detected phase of the LO signal being used to identify phase discontinuity of the LO signal;
means for generating a single-tone signal used to detect the phase of the LO signal when the means for generating is powered on and means for downconverting the single-tone signal with the LO signal in a calibration mode and downconverting an amplified radio frequency (RF) signal with the LO signal in a receive mode.

34. A non-transitory computer-readable medium comprising:
- code for causing at least one processor to direct generation of a local oscillator (LO) signal, used for frequency conversion, by an LO generator that is periodically powered on and off; and
- code for causing the at least one processor to direct detection of a phase of the LO signal when the LO generator is powered on, the detected phase of the LO signal being used to identify phase discontinuity of the LO signal, wherein the code for causing the at least one processor to direct detection of a phase of the LO signal is further configured to:
  - compare digital samples for a first measurement interval with digital samples for a second measurement interval; and
  - determine a phase change between the first and second measurement interval based on the comparison results of the digital samples.

* * * * *